(12) United States Patent
Liu

(10) Patent No.: US 10,989,366 B2
(45) Date of Patent: Apr. 27, 2021

(54) BACKLIGHT MODULE, AND DISPLAY DEVICE USING BACKLIGHT MODULE

(71) Applicant: WUHAN CHINA STAR OPTOELECTRONICS TECHNOLOGY CO., LTD., Wuhan (CN)

(72) Inventor: Fancheng Liu, Wuhan (CN)

(*) Notice: Subject to any disclaimer, the term of this patent is extended or adjusted under 35 U.S.C. 154(b) by 0 days.

(21) Appl. No.: 16/349,264

(22) PCT Filed: Feb. 12, 2019

(86) PCT No.: PCT/CN2019/074812
§ 371 (c)(1),
(2) Date: May 12, 2019

(87) PCT Pub. No.: WO2020/107709
PCT Pub. Date: Jun. 4, 2020

(65) Prior Publication Data
US 2020/0271280 A1    Aug. 27, 2020

(30) Foreign Application Priority Data
Nov. 30, 2018    (CN) .......................... 201811459548.7

(51) Int. Cl.
*F21K 9/60* (2016.01)
*G09G 3/3233* (2016.01)
*H01L 27/32* (2006.01)
*G02F 1/13357* (2006.01)

(52) U.S. Cl.
CPC .......... *F21K 9/60* (2016.08); *G02F 1/133603* (2013.01); *G02F 1/133606* (2013.01); *G02F 1/133611* (2013.01); *G09G 3/3233* (2013.01); *H01L 27/3241* (2013.01); *H01L 2251/5361* (2013.01)

(58) Field of Classification Search
CPC ......... G02F 1/133603; G02F 1/133609; G02F 1/133611
See application file for complete search history.

(56) References Cited

U.S. PATENT DOCUMENTS 9,658,475 B2*  5/2017  Kim .................. G02F 1/133603

FOREIGN PATENT DOCUMENTS

| CN | 101118341 A | 2/2008 |
|----|-------------|--------|
| CN | 102902089 A | 1/2013 |
| CN | 107490 A | 12/2017 |
| KR | 20130112522 A | 10/2013 |

* cited by examiner

*Primary Examiner* — Matthew J. Peerce

(57) ABSTRACT

The present invention provides a backlight module and a display device using the backlight module. The present invention has the following advantage: An LED light shadow can be effectively optimized, and an overall display effect of a mini-LED can be improved; a problem of a mini-LED light shadow is optimized without increasing a module thickness and a module power loss as much as possible; and with a same thickness, a design of fewer LED lights can be implemented, and costs of medium- and large-sized mini-LED modules can be reduced.

17 Claims, 2 Drawing Sheets

BACKLIGHT MODULE, AND DISPLAY DEVICE USING BACKLIGHT MODULE

FIELD OF INVENTION

The present invention relates to the field of display devices, and in particular, to a backlight module and a display device using the backlight module.

BACKGROUND OF INVENTION

A high dynamic range (HDR) has become a standard configuration for high-order display. For a TFT-LCD display technology, indexes such as a color gamut, contrast, and luminance are increasingly high, to contend with an OLED display technology. However, in the TFT-LCD technology, generally, a high color gamut is achieved at the expense of luminance, and static contrast is also poor. Consequently, it has been very difficult to improve performance of a TFT-LCD with side backlight.

To achieve a high color gamut, vendors have been developing QD-BL and QD-CF technologies, and the like. To increase contrast, a direct-type area source partitioning technology is used, to divide a backlight source into units independently controlled in a plurality of areas, that is, divide the backlight source into a plurality of mini-LEDs, and luminance of a corresponding backlight area is accurately adjusted according to distribution of bright and dark parts of each frame of image, to increase dynamic contrast, and significantly improve image display quality.

Technical Problem

The structure has the following disadvantage: The mini-LED has a problem of poor LED light shadow blocking. At present, there are generally three methods to handle an LED light shadow: 1: A quantity of LEDs is increased, but costs are increased. 2. A diffusion plate of a high haze is used for blocking at the expense of transmittance. 3. An air gap between an LED and a membrane is enlarged, but it is more difficult to support a membrane material, an overall module thickness is increased, the method is inapplicable to a narrow-bezel product, and overall shockproof performance of the product is poor.

SUMMARY OF INVENTION

A technical problem to be solved by the present invention is to provide a backlight module and a display device using the backlight module, to effectively optimize an LED light shadow, and improve an overall display effect of a mini-LED.

To solve the foregoing problem, the present invention provides a backlight module, including a plurality of LED light-emitting chips and a quantum dot film. The quantum dot film is disposed on out-light sides of the LED light-emitting chips. The out-light sides of the LED light-emitting chips are further provided with a plurality of diffusion blocks. The diffusion blocks are in a one-to-one correspondence with the LED chips respectively. There is a plurality of particles in the diffusion blocks. A particle size of the particle is greater than 15 micrometers. A haze of the diffusion blocks are greater than 80%.

In an embodiment, the diffusion blocks are disposed on a side of the quantum dot film toward the LED light-emitting chips.

In an embodiment, a width of each of the diffusion blocks satisfies the following formula: $W=2*H*\tan(½*α)$, where W is the width of each of the diffusion blocks, H is a distance between the LED light-emitting chips and the quantum dot film, and a is an optical angle of the LED light-emitting chips.

In an embodiment, the diffusion blocks are disposed on a side of the quantum dot film away from the LED light-emitting chips.

In an embodiment, a width of each of the diffusion blocks satisfies the following formula: $W=2*(H+H1)*\tan(½*α)$, where W is the width of each of the diffusion blocks, H is a distance between the LED light-emitting chips and the quantum dot film, H1 is a thickness of the quantum dot film, and a is an optical angle of the LED light-emitting chips.

In an embodiment, a width of each of the LED light-emitting chips is less than a width of each of the diffusion blocks.

In an embodiment, the backlight module further includes at least one diffuser film, and the diffuser film is disposed on one side of the quantum dot film away from the LED light-emitting chips.

To solve the foregoing problem, the present invention further provides a backlight module, including a plurality of LED light-emitting chips and a quantum dot film. The quantum dot film is disposed on out-light sides of the LED light-emitting chips. The out-light sides of the LED light-emitting chips are further provided with a plurality of diffusion blocks. The diffusion blocks are in a one-to-one correspondence with the LED chips respectively.

In an embodiment, the diffusion blocks are disposed on one side of the quantum dot film toward the LED light-emitting chips.

In an embodiment, a width of each of the diffusion blocks satisfies the following formula: $W=2*H*\tan(½*α)$, where W is the width of each of the diffusion blocks, H is a distance between the LED light-emitting chips and the quantum dot film, and a is an optical angle of the LED light-emitting chips.

In an embodiment, the diffusion blocks are disposed on one side of the quantum dot film away from the LED light-emitting chips.

In an embodiment, a width of each of the diffusion blocks satisfies the following formula: $W=2*(H+H1)*\tan(½*α)$, where W is the width of each of the diffusion blocks, H is a distance between the LED light-emitting chips and the quantum dot film, H1 is a thickness of the quantum dot film, and a is an optical angle of the LED light-emitting chips.

In an embodiment, there is a plurality of particles in the diffusion blocks, and a particle size of the particle is greater than 15 micrometers.

In an embodiment, a haze of the diffusion blocks are greater than 80%.

In an embodiment, a width of each of the LED light-emitting chips is less than a width of each of the diffusion blocks.

In an embodiment, the backlight module further includes at least one diffuser film, and the diffuser film is disposed on one side of the quantum dot film away from the LED light-emitting chips.

The present invention provides a display device, including the backlight module according to claim 1 and an LCD display panel disposed on the backlight module.

Beneficial Effect

The present invention has the following advantage: Each of the LED light-emitting chips corresponds to one diffusion block, so that light emitted by each of the LED light-emitting chips is further diffused, and an air gap between two adjacent LED light-emitting chips is filled by the diffused light, thereby effectively optimizing an LED light shadow, and improving an overall display effect of a mini-LED. In the present invention, for a backlight module, a problem of a mini-LED light shadow is optimized without increasing a module thickness and a module power loss as much as possible; and with a same thickness, a design of fewer LED lights can be implemented, and costs of medium- and large-sized mini-LED modules can be reduced.

DETAILED DESCRIPTION OF PREFERRED EMBODIMENTS

Specific implementations of a backlight module and a display device using the backlight module that are provided in the present invention are described in detail below with reference to the accompanying drawings.

Figure 1:
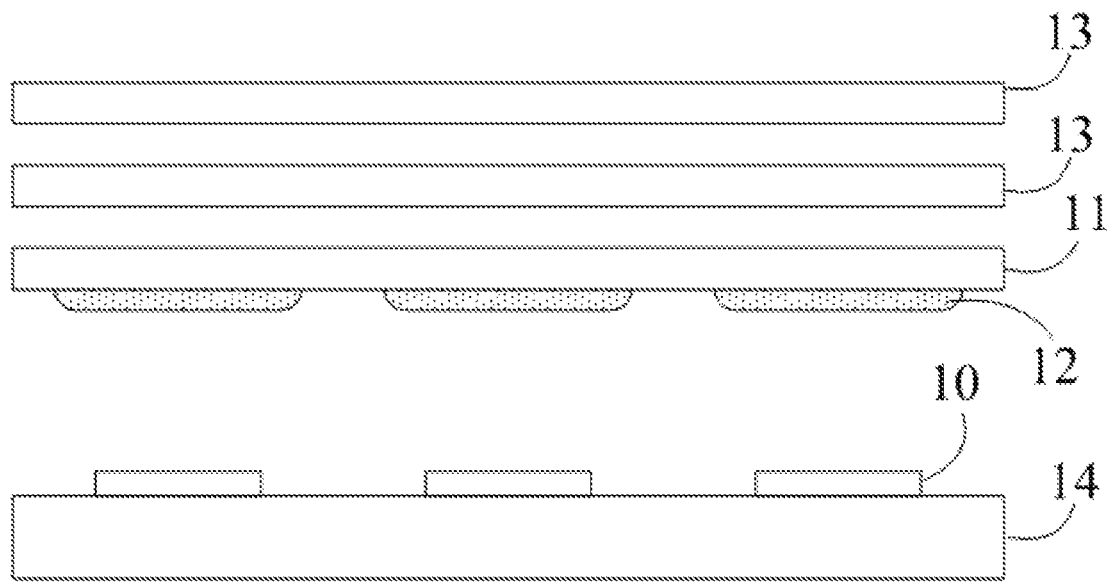
FIG. 1 is a schematic exploded structural view of a first embodiment of a backlight module according to the present invention.
Figure 2:
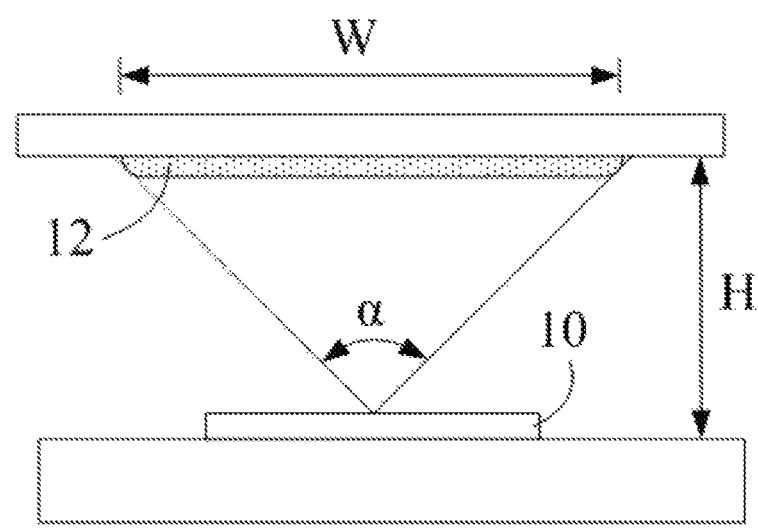
FIG. 2 is a schematic partial structural view of the first embodiment of the backlight module according to the present invention.

FIG. 1 is a schematic exploded structural view of a first embodiment of a backlight module according to the present invention. FIG. 2 is a schematic partial structural view of the first embodiment of the backlight module according to the present invention. Referring to FIG. 1 and FIG. 2, the backlight module in the present invention includes a plurality of LED light-emitting chips 10 and a quantum dot film 11.

The LED light-emitting chip 10 is used as a light source for the backlight module. The plurality of LED light-emitting chips 10 is arranged in a matrix. Sizes and a quantity of the LED light-emitting chips 10 may be selected according to a design requirement. The plurality of LED light-emitting chips 10 may be disposed on a light source circuit board 14.

The quantum dot film 11 is disposed on out-light sides of the LED light-emitting chips 10. In details, on the out-light sides of the LED light-emitting chips 10, the quantum dot film 11 covers all the LED light-emitting chips 10, and there is a distance between the quantum dot film 11 and the LED light-emitting chip 10. The quantum dot film 11 is configured to convert light emitted by the LED light-emitting chip into white light. In the present embodiment, the LED light-emitting chip 10 is a Blu-ray chip, so that the light emitted by the LED light-emitting chip 10 irradiates the quantum dot film 11 and then is emergent, and the light emergent from the LED light-emitting chip 10 is white light. A structure of the quantum dot film 11 is a conventional structure in the backlight module, and details are not described.

The out-light sides of the LED light-emitting chips 10 are further provided with a plurality of diffusion blocks 12, and the diffusion block 12 is in a one-to-one correspondence with the chip 10. In details, one LED chip 10 corresponds to one diffusion block 12. The diffusion block 12 is configured to diffuse the light emitted by the LED light-emitting chip 10. The backlight module of the present invention has the following advantage: Each LED light-emitting chip 10 corresponds to one diffusion block 12, so that the light emitted by the LED light-emitting chip 10 is further diffused, and an air gap between two adjacent LED light-emitting chips 10 is filled by the diffused light thereby effectively optimizing an LED light shadow, and improving an overall display effect of a mini-LED; and basically, an overall module thickness of the mini-LED is not increased, to implement a light and thin product.

In the first embodiment, the diffusion block 12 is disposed on a side of the quantum dot film 11 toward the LED light-emitting chip 10. In details, the diffusion block 12 is disposed on a surface of the quantum dot film 11, and the surface is toward the LED light-emitting chip 10. To further improve a diffusion effect of the diffusion block 12, in the present embodiment, a width of the diffusion block 12 satisfies a particular condition. In details, in the present embodiment, referring to FIG. 2, the width of the diffusion block 12 satisfies the following formula:

$$W=2*H*\tan(\tfrac{1}{2}*\alpha)$$

where W is the width of the diffusion block 12, H is the distance between the LED light-emitting chip 10 and the quantum dot film 11, and a is an optical angle of the LED light-emitting chip 10.

To further diffuse the light emitted by the LED light-emitting chip 10, there is a plurality of particles in the diffusion block 12. A particle size of the particle is greater than 15 micrometers, to improve a diffusion effect of the light emitted by the LED light-emitting chip 10. The particle includes, but is not limited to, a resin particle. The diffusion block 12 may be prepared by using a conventional method. An example is used to describe the method for preparing the diffusion block 12: a. adding microparticles to a solvent, and stirring until the microparticles are evenly dispersed in the solvent; b. adding coating resin and a curing agent to a mixture obtained in step a, and stirring thoroughly; and c. providing a coating mask including a mesh corresponding to a gap between mini-LEDs, spreading the coating mask, and evenly coating a mixture obtained in step b on a quantum dot layer, to form the diffusion block.

Optionally, a haze of the diffusion block 12 is greater than 80%, to further improve a diffusion function of the diffusion block 12. Further, a width of the LED light-emitting chip 10 is less than the width of the diffusion block 12, to ensure that the light emitted by the LED light-emitting chip 10 is diffused to a junction between two LED light-emitting chips 10.

Further, the backlight module further includes at least one diffuser film 13, and the diffuser film 13 is disposed on a side of the quantum dot film 11 away from the LED light-emitting chip 10. In details, in the present embodiment, two diffuser films 13 are disposed on the side of the quantum dot film 11 away from the LED light-emitting chip 10. In another embodiment of the backlight module in the present invention, the side of the quantum dot film 11 away from the LED light-emitting chip 10 may also be provided with another optical component, to improve a light emission performance of the backlight module.

Figure 3:
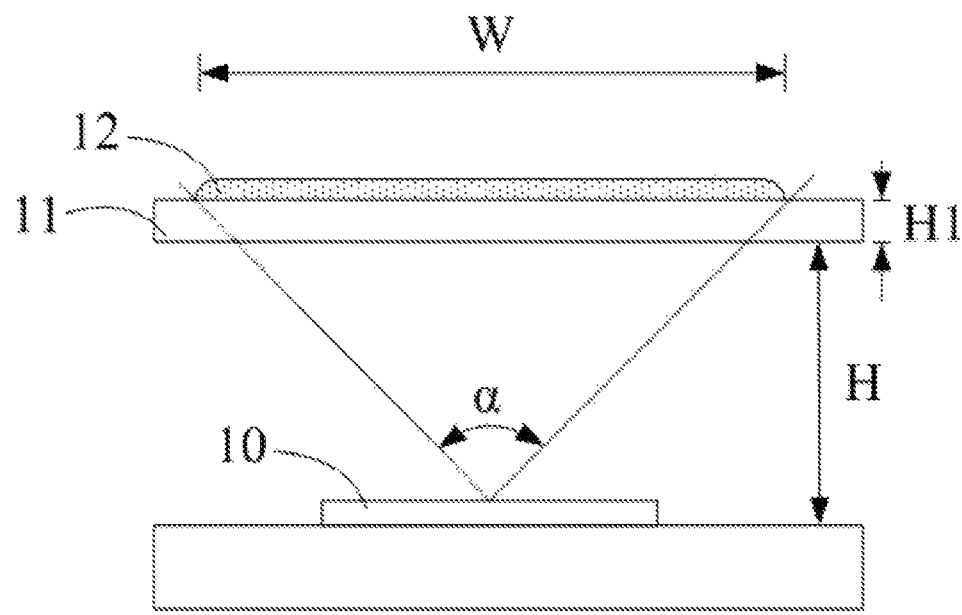
FIG. 3 is a schematic partial structural view of a second embodiment of a backlight module according to the present invention.

FIG. 3 is a schematic partial structural view of a second embodiment of a backlight module according to the present invention. Referring to FIG. 3, a difference between the second embodiment and the first embodiment of the present invention lies in that, the diffusion blocks are disposed at a different position and has a different size. In details, in the second embodiment, the diffusion block 12 is disposed on the side of the quantum dot film 11 away from the LED light-emitting chip 10, that is, the diffusion block 12 is disposed on a surface of the quantum dot film 11, and the surface is away from the LED light-emitting chip 10. That is, the quantum dot film 11 is disposed between the diffusion block 12 and the LED light-emitting chip 10, there is a distance between the quantum dot film 11 and the LED light-emitting chip 10, and the diffusion block 12 is disposed on the surface of the quantum dot film 11. To further improve the diffusion effect of the diffusion block 12, in the present embodiment, the width of the diffusion block 12 satisfies a particular condition. In details, in the present embodiment, referring to FIG. 3, the width of the diffusion block 12 satisfies the following formula:

$$W=2*(H+H1)*\tan(\tfrac{1}{2}*\alpha)$$

where W is the width of the diffusion block, H is the distance between the LED light-emitting chip and the quantum dot film, H1 is a thickness of the quantum dot film, and a is an optical angle of the LED light-emitting chip.

Figure 4:
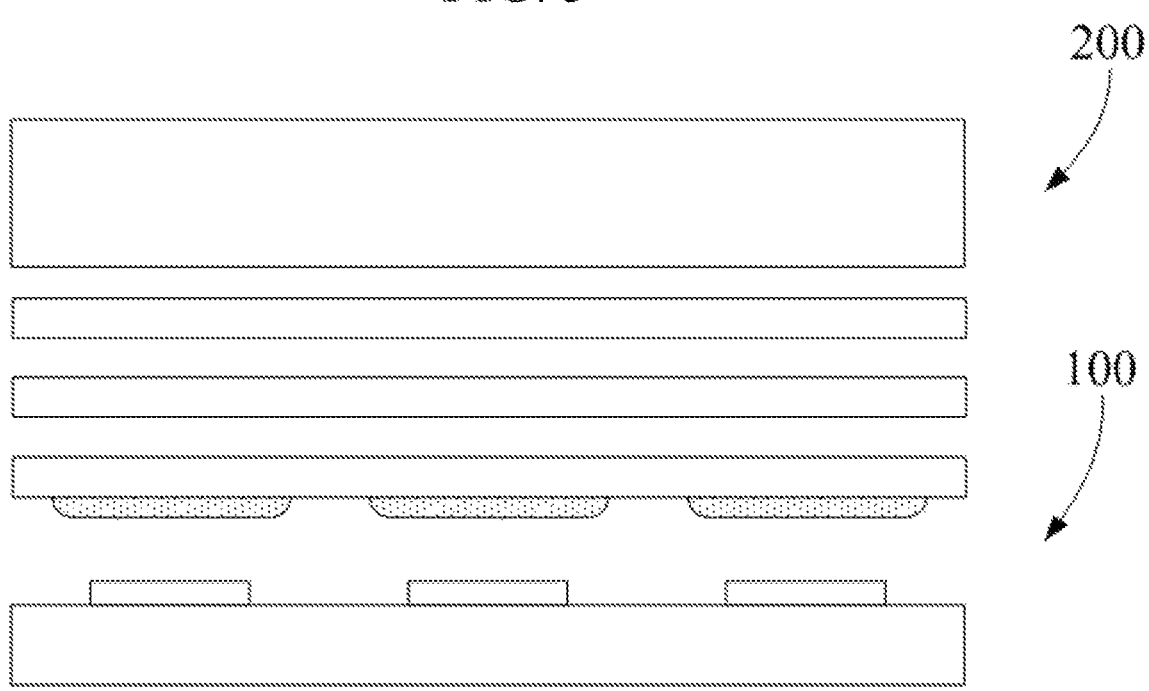
FIG. 4 is a schematic structural view of a display panel according to the present invention.

The present invention further provides a display device. FIG. 4 is a schematic structural view of a display panel according to the present invention. Referring to FIG. 4, the display panel in the present invention includes a backlight module 100 and an LCD display panel 200 disposed on the backlight module 100. A structure of the backlight module 100 is the same as a structure of the foregoing backlight module, and the backlight module 100 provides a backlight source for the LCD display panel 200.

The display device in the present invention has the following advantage: An air gap between two adjacent LED light-emitting chips in the backlight module 100 is filled by diffused light, thereby effectively optimizing an LED light shadow, and improving an overall display effect of the display device; and basically, a thickness of the display device is not increased, the overall display effect of the display device is improved, and a product thickness is not affected.

The foregoing descriptions are merely preferred implementations of the present invention. It should be noted that a person of ordinary skill in the art may make several improvements or refinements without departing from the principle of the present invention, and the improvements or refinements shall fall within the protection scope of the present invention.

INDUSTRIAL APPLICABILITY

The subject matter in the present disclosure can be manufactured and used in the industry and has industrial applicability.

What is claimed is:

1. A backlight module, comprising a plurality of LED light-emitting chips and a quantum dot film, wherein the quantum dot film is disposed on out-light sides of the LED light-emitting chips; the out-light sides of the LED light-emitting chips are further provided with a plurality of diffusion blocks; the diffusion blocks are spaced apart from each other and in a one-to-one correspondence with the LED chips respectively; an air gap is defined between adjacent ones of the LED chips; there is a plurality of particles in the diffusion blocks; a particle size of the particles is greater than 15 micrometers; and a haze of the diffusion blocks is greater than 80%.

2. The backlight module according to claim 1, wherein the diffusion blocks are disposed on a side of the quantum dot film toward the LED light-emitting chips.

3. The backlight module according to claim 2, wherein a width of each of the diffusion blocks satisfies the following formula: $W=2*H*\tan(\tfrac{1}{2}*\alpha)$, wherein W is the width of each of the diffusion blocks, H is a distance between the LED light-emitting chips and the quantum dot film, and a is an optical angle of the LED light-emitting chips.

4. The backlight module according to claim 1, the diffusion blocks are disposed on a side of the quantum dot film away from the LED light-emitting chip.

5. The backlight module according to claim 4, wherein a width of each of the diffusion blocks satisfy the following formula: $W=2*(H+H1)*\tan(\tfrac{1}{2}*\alpha)$, wherein W is the width of each of the diffusion blocks, H is a distance between the LED light-emitting chips and the quantum dot film, H1 is a thickness of the quantum dot film, and a is an optical angle of the LED light-emitting chips.

6. The backlight module according to claim 1, wherein a width of each of the LED light-emitting chips is less than a width of each of the diffusion blocks.

7. The backlight module according to claim 1, the backlight module further comprises at least one diffuser film, and the diffuser film is disposed on a side of the quantum dot film away from the LED light-emitting chips.

8. A backlight module, comprising a plurality of LED light-emitting chips and a quantum dot film, wherein the quantum dot film is disposed on out-light sides of the LED light-emitting chips; the out-light sides of the LED light-emitting chips are further provided with a plurality of diffusion blocks; the diffusion blocks are spaced apart from each other and in a one-to-one correspondence with the LED chips respectively; and an air gap is defined between adjacent ones of the LED chips.

9. The backlight module according to claim 8, wherein the diffusion blocks are disposed on a side of the quantum dot film toward the LED light-emitting chips.

10. The backlight module according to claim 9, wherein a width of each of the diffusion blocks satisfies the following formula: $W=2*H*\tan(\tfrac{1}{2}*\alpha)$, wherein W is the width of the diffusion block, H is a distance between the LED light-emitting chip and the quantum dot film, and $\alpha$ is an optical angle of the LED light-emitting chips.

11. The backlight module according to claim 8, wherein the diffusion blocks are disposed on a side of the quantum dot film away from the LED light-emitting chips.

12. The backlight module according to claim 11, wherein a width of each of the diffusion blocks satisfies the following formula: $W=2*(H+H1)*\tan(\tfrac{1}{2}*\alpha)$, wherein W is the width of each of the diffusion blocks, H is a distance between the LED light-emitting chips and the quantum dot film, H1 is a thickness of the quantum dot film, and $\alpha$ is an optical angle of the LED light-emitting chips.

13. The backlight module according to claim 8, wherein there is a plurality of particles in the diffusion blocks, and a particle size of the particles is greater than 15 micrometers.

14. The backlight module according to claim 8, wherein a haze of the diffusion blocks is greater than 80%.

15. The backlight module according to claim 8, wherein a width of the LED light-emitting chip is less than a width of each of the diffusion blocks.

16. The backlight module according to claim 8, wherein the backlight module further comprises at least one diffuser film, and the diffuser film is disposed on a side of the quantum dot film away from the LED light-emitting chip.

17. A display device, comprising the backlight module according to claim 8 and an LCD display panel disposed on the backlight module.

* * * * *